United States Patent
Gaska et al.

(10) Patent No.: US 8,633,468 B2
(45) Date of Patent: Jan. 21, 2014

(54) LIGHT EMITTING DEVICE WITH DISLOCATION BENDING STRUCTURE

(75) Inventors: Remigijus Gaska, Columbia, SC (US); Jinwei Yang, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 63 days.

(21) Appl. No.: 13/370,470

(22) Filed: Feb. 10, 2012

(65) Prior Publication Data

US 2012/0205619 A1    Aug. 16, 2012

Related U.S. Application Data

(60) Provisional application No. 61/441,674, filed on Feb. 11, 2011.

(51) Int. Cl.
*H01L 29/06* (2006.01)

(52) U.S. Cl.
USPC .............................................. 257/13; 438/20

(58) Field of Classification Search
USPC .............................................. 257/13; 438/20
See application file for complete search history.

(56) References Cited

U.S. PATENT DOCUMENTS

| | | | |
|---|---|---|---|
| 6,630,692 B2 | 10/2003 | Goetz et al. | |
| 6,943,377 B2 | 9/2005 | Gaska et al. | |
| 7,326,963 B2 | 2/2008 | Gaska et al. | |
| 7,537,950 B2 | 5/2009 | Gaska et al. | |
| 7,554,123 B2 | 6/2009 | Gaska et al. | |
| 7,619,238 B2 | 11/2009 | Gaska et al. | |
| 2008/0274574 A1 | 11/2008 | Yun | |
| 2009/0032828 A1* | 2/2009 | Romano et al. | 257/94 |
| 2009/0039361 A1 | 2/2009 | Li et al. | |

FOREIGN PATENT DOCUMENTS

| | | |
|---|---|---|
| EP | 2200187 A1 | 6/2010 |
| JP | 2002075873 A | 3/2002 |

OTHER PUBLICATIONS

Park, International Application No. PCT/US2012/024774, International Search Report and the Written opinion of the International Searching Authority, SETI-0065-PCT, Jul. 31, 2012, 9 pages.
Shur et al., "Deep-Ultraviolet Light-Emitting Diodes", IEEE Transactions on Electronic Devices, vol. 57, No. 1, Jan. 2010, pp. 12-25.
Sun et al., "Efficiency droop in 245-247 nm AlGaN light-emitting diodes with continuous wave 2 mW output power", Applied Physics Letters, 96, 061102, 2010, 4 pages.

(Continued)

*Primary Examiner* — Jami M Valentine
(74) *Attorney, Agent, or Firm* — LaBatt, LLC (57) ABSTRACT

A solution for reducing a number of dislocations in an active region of an emitting device is provided. A dislocation bending structure can be included in the emitting device between the substrate and the active region. The dislocation bending structure can be configured to cause dislocations to bend and/or annihilate prior to reaching the active region, e.g., due to the presence of a sufficient amount of strain. The dislocation bending structure can include a plurality of layers with adjacent layers being composed of a material, but with molar fractions of an element in the respective material differing between the two layers. The dislocation bending structure can include at least forty pairs of adjacent layers having molar fractions of an element differing by at least five percent between the adjacent layers.

27 Claims, 9 Drawing Sheets

(56) References Cited

OTHER PUBLICATIONS

Shatalov et al., "Large Chip High Power Deep Ultraviolet Light-Emitting Diodes", Applied Physics Express 3, Apr. 10, 2010, 062101, 3 pages.

Kisin et al., Modeling of Injection Characteristics of Polar and Nonpolar III-Nitride Multiple Quantum Well Structures, Journal of Applied Physics 107, 103106, 2010, 10 pages.

Saxler, A. et al., "Aluminum gallium nitride short-period superlattices doped with magnesium," Applied Physics Letters, vol. 74, No. 14, Apr. 5, 1999, pp. 2023-2025.

Peng, H. et al., "Ultraviolet light-emitting diodes operating in the 340 nm wavelength range and application to time-resolved fluorescence spectroscopy," Applied Physics Letters, vol. 85, No. 8, Aug. 23, 2004, pp. 1436-1438.

Goepfert, I.D. et al., "Experimental and theoretical study of acceptor activation and transport properties in p-type $Al_xGa_{1-x}N$/GaN superlattices," Journal of Applied Physics, vol. 88, No. 4, Aug. 15, 2000, pp. 2030-2038.

Wang, T. et al., "1 mW AlInGaN-based ultraviolet light-emitting diode with an emission wavelength of 348 nm grown on sapphire substrate," Applied Physics Letters, vol. 81, No. 14, Sep. 30, 2002, pp. 2508-2510.

Nishida, Toshio et al., "Efficient and high-power AlGaN-based ultraviolet light-emitting diode grown on bulk GaN," Applied Physics Letters, vol. 79, No. 6, Aug. 6, 2001, pp. 711-712.

Kozodoy, Peter et al., "Polarization-enhanced Mg doping of AlGaN/GaN superlattices," Applied Physics Letters, vol. 75, No. 16, Oct. 18, 1999, pp. 2444-2446.

Shur, M.S. et al., "Accumulation hole layer in p-GaN/AlGaN heterostructures," Applied Physics Letters, vol. 76, No. 21, May 22, 2000, pp. 3061-3063.

Zhang, J.P. et al., "Milliwatt power deep ultraviolet light-emitting diodes over sapphire with emission at 278 nm," Applied Physics Letters, vol. 81, No. 26, Dec. 23, 2002, pp. 4910-4912.

Zhang, J.P. et al., "AlGaN multiple-quantum-well-based, deep ultraviolet light-emitting diodes with significantly reduced long-wave emission," Applied Physics Letters, vol. 83, No. 17, Oct. 27, 2003, pp. 3456-3458.

Chitnis, A. et al., "Improved performance of 325-nm emission AlGaN ultraviolet light-emitting diodes," Applied Physics Letters, vol. 82, No. 16, Apr. 21, 2003, pp. 2565-2567.

Sun, W.H. et al., "AlGaN-based 280 nm light-emitting diodes with continuous wave powers in excess of 1.5 mW," Applied Physics Letters, vol. 85, No. 4, Jul. 26, 2004, pp. 531-533.

Adivarahan, V. et al., "High-efficiency 269 nm emission deep ultraviolet light-emitting diodes," Applied Physics Letters, vol. 84, No. 23, Jun. 7, 2004, pp. 4762-4764.

Yasan, A. et al., "4.5 mW operation of AlGaN-based 267 nm deep-ultraviolet light-emitting diodes," Applied Physics Letters, vol. 83, No. 23, Dec. 8, 2003, pp. 4701-4703.

Fischer, A.J. et al., "Room-temperature direct current operation of 290 nm light-emitting diodes with milliwatt power levels," Applied Physics Letters, vol. 84, No. 17, Apr. 26, 2004, pp. 3394-3396.

Tamulaitis, G. et al., "Dislocation-limited Lifetime of Nonequilibrium Carriers in AlGaN Epilayers," Proceedings of ICPS-27 (2004), pp. 1-2.

Kamiyama, S. et al., "Heteroepitaxial technology for high-efficiency UV light-emitting diode," Opto-Electronics Review, 10, No. 4, 2002, pp. 225-230.

Bulashevich et al., "Simulation of Visible and Ultra-Violet Group-III Nitride Light Emitting Diodes", J. Comput. Phys. 213, No. 1, 214-238, Sep. 14, 2006, 39 pages.

\* cited by examiner

LIGHT EMITTING DEVICE WITH DISLOCATION BENDING STRUCTURE

REFERENCE TO RELATED APPLICATIONS

The current application claims the benefit of U.S. Provisional Application No. 61/441,674, titled "Light Emitting Diodes with Dislocation Bending Structure," which was filed on 11 Feb. 2011, and which is hereby incorporated by reference.

GOVERNMENT LICENSE RIGHTS

This invention was made with government support under contract no. W911 NF-10-2-0023 awarded by the Defense Advanced Research Projects Agency (DARPA). The government has certain rights in the invention.

TECHNICAL FIELD

The disclosure relates generally to emitting devices, and more particularly, to an emitting device having a dislocation bending structure, which can improve the light output of the device.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_y Al_x Ga_{1-x-y} N$, where x and y indicate the molar fraction of a given element, $0 \leq x, y \leq 1$, and $0 \leq x+y \leq 1$. Other illustrative group III nitride based LEDs and LDs are based on boron (B) nitride (BN) and can be of the form $Ga_z In_y Al_x B_{1-x-y-z} N$, where $0 \leq x, y, z \leq 1$, and $0 \leq x+y+z \leq 1$.

An LED is typically composed of layers. Each layer has a particular combination of molar fractions (e.g., given values of x, y, and/or z) for the various elements. An interface between two layers is defined as a semiconductor heterojunction. At an interface, the combination of molar fractions is assumed to change by a discrete amount. A layer in which the combination of molar fractions changes continuously is said to be graded.

Changes in molar fractions of semiconductor alloys allow for band gap control and are used to form barrier and quantum well (QW) layers. A quantum well comprises a semiconducting layer located between two other semiconducting layers, each of which has a larger band gap than the band gap of the quantum well. A difference between a conduction band energy level of a quantum well and a conduction band energy level of the neighboring semiconductor layers is referred to as a depth of a quantum well. In general, the depth of a quantum well can differ for each side of the quantum well. A barrier comprises a semiconductor layer located between two other semiconductor layers, each of which has a smaller band gap than the band gap of the barrier. A difference between a conduction band energy level of a barrier and a conduction band energy level of a neighboring semiconductor layer is referred to as barrier height. In general, the barrier height of a barrier can differ for each side of the barrier.

A stack of semiconductor layers can include several n-type doped layers and one or more p-type doped layers. An active region of an LED is formed in proximity of a p-n junction where electron and hole carriers recombine and emit light. The active region typically includes quantum wells and barriers for carrier localization and improved radiative recombination. Inside a quantum well, electrons and holes are described quantum mechanically in terms of wave functions. Each wave function is associated with a local energy level inside a given quantum well. An overlap of electron and hole wave functions leads to radiative recombination and light production.

A group III nitride LED is typically grown as a wurtzite or zinc blende crystal structure. At a heterojunction, the lattice mismatch of the two semiconductor layers causes stresses and strains of the crystal layers and leads to the development of a built-in electric field. In addition, a wurtzite crystal structure exhibits internal electric fields due to spontaneous polarization. The internal electric fields can lead to reduced overlap of electron and hole wave functions and, as a consequence, to reduced light emission.

Furthermore, the stack of semiconductor layers are typically grown on a sapphire or silicon carbide substrate structure. A large lattice mismatch between the substrate and the semiconductor layers can cause dislocations, which reduce the light emission of the device.

SUMMARY OF THE INVENTION

Aspects of the invention provide a solution for reducing a number of dislocations in an active region of an emitting device. A dislocation bending structure can be included in the emitting device between the substrate and the active region. The dislocation bending structure can be configured to cause dislocations to bend and/or annihilate prior to reaching the active region, e.g., due to the presence of a sufficient amount of strain. The dislocation bending structure can include a plurality of layers with adjacent layers being composed of a material, but with molar fractions of an element in the respective material differing between the two layers. The dislocation bending structure can include at least forty pairs of adjacent layers having molar fractions of an element differing by at least five percent between the adjacent layers.

A first aspect of the invention provides an emitting device comprising: a substrate; an active region located on a first side of the substrate; and a dislocation bending structure located between the substrate and the active region, wherein the dislocation bending structure comprises at least forty pairs of adjacent layers, wherein each pair of adjacent layers includes: a first layer composed of a material including an element; and a second layer composed of a material including the element, wherein a molar fraction of the element differs for the first layer and the second layer by at least five percent.

A second aspect of the invention provides an emitting device comprising: a substrate; an active region located on a first side of the substrate; and a dislocation bending structure located between the substrate and the active region, wherein the dislocation bending structure comprises a means for causing at least some dislocations propagating from the substrate to at least one of: bend or annihilate prior to reaching the active region.

A third aspect of the invention provides a method of manufacturing an emitting device, the method comprising: forming a dislocation bending structure on a first side of a substrate, wherein the dislocation bending structure comprises a means for causing at least some dislocations propagating from the substrate to at least one of: bend or annihilate prior to reaching the active region; and forming an active region on an opposing side of the dislocation bending structure as the substrate.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solution for reducing a number of dislocations in an active region of an emitting device. A dislocation bending structure can be included in the emitting device between the substrate and the active region. The dislocation bending structure can be configured to cause dislocations to bend and/or annihilate prior to reaching the active region, e.g., due to the presence of a sufficient amount of strain. The dislocation bending structure can include a plurality of layers with adjacent layers being composed of a material, but with molar fractions of an element in the respective material differing between the two layers. The dislocation bending structure can include at least forty pairs of adjacent layers having molar fractions of an element differing by at least five percent between the adjacent layers. As used herein, unless otherwise noted, the term "set" means one or more (i.e., at least one) and the phrase "any solution" means any now known or later developed solution.

Figure 1:
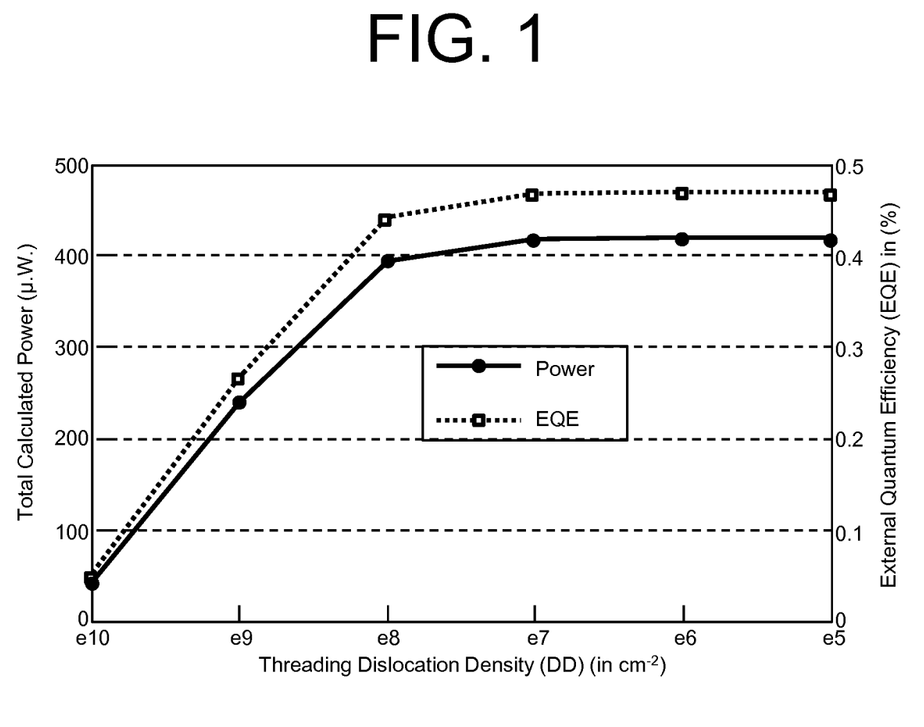
FIG. 1 shows simulated light emission power and external quantum efficiency versus threading dislocation density according to an embodiment.

Turning to the drawings, FIG. 1 shows simulated light emission power and external quantum efficiency versus threading dislocation density according to an embodiment. As illustrated, as the threading dislocation density increases beyond a cutoff point, e.g., approximately $10^8$ cm$^{-2}$, the external quantum efficiency and light emission power no longer improve.

Figure 2:
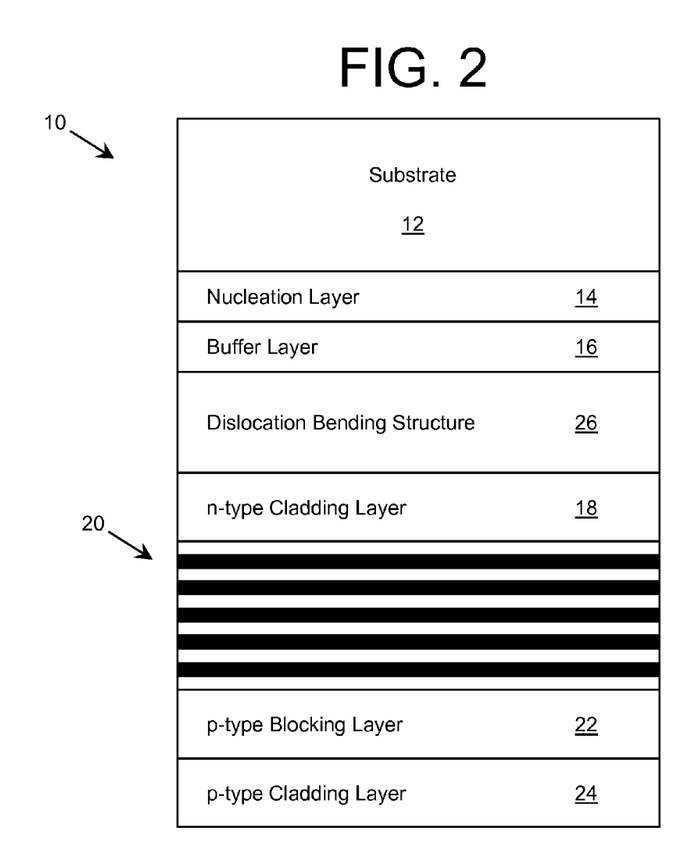
FIG. 2 shows an illustrative design of an emitting device according to an embodiment.

FIG. 2 shows an illustrative design of an emitting device 10 according to an embodiment. In an embodiment, emitting device 10 is configured to operate as a light emitting diode (LED). Alternatively, emitting device 10 can be configured to operate as a laser diode (LD). In either case, during operation of emitting device 10 an active region 20 of the emitting device 10 emits electromagnetic radiation. The electromagnetic radiation emitted by emitting device 10 can comprise a peak wavelength within any range of wavelengths, including visible light, ultraviolet radiation, deep ultraviolet radiation, infrared light, and/or the like.

As illustrated, emitting device 10 can include a substrate 12, a nucleation (initiation) layer 14, a buffer layer 16, an n-type cladding layer 18, the active region 20, a p-type blocking layer 22, and a p-type cladding layer 24. In general, a dislocation can initiate at an interface between the substrate 12 and an adjacent layer, such as the nucleation layer 14, and can propagate into the other layers, including the active region 20, due to strain. Performance of the emitting device 10 strongly depends on a density of the dislocations in the active region 20.

To this extent, the emitting device 10 includes a dislocation bending structure 26, which is located between the substrate 12 and the active region 20. The dislocation bending structure 26 can be configured to cause dislocations propagating from the substrate 12 to bend and/or partially annihilate due to strain. In an embodiment, the dislocation bending structure 26 comprises a plurality of layers having different bandgaps and/or different built-in polarization fields. For example, adjacent layers in the dislocation bending structure 26 can be composed of different compositions of a material. The different material compositions can result in high electric fields due to spontaneous and/or piezoelectric polarization. The polarization fields and/or composition changes at the heterointerfaces between the adjacent layers can affect the dislocation propagation and lead to dislocation bending. In a further embodiment, the dislocation bending structure 26 can comprise a periodic structure, in which each of a plurality of periods includes at least two layers of different compositions.

For dislocation bending to occur, dislocation bending structure 26 can create a strain exceeding a certain critical value. In general, strain is dependent on a thickness of a layer and/or a difference in the materials of adjacent layers (e.g., in a period of the dislocation bending structure 26). For example, strain can increase as the thickness of the layer increases. Additionally, for adjacent layers composed of a material, strain can increase as a difference in a molar fraction of an element in the material of each layer is increased. In an embodiment, dislocation bending structure 26 is configured to have strain sufficiently large to induce dislocation bending, but not so large as to cause cracking. In an embodiment, the dimensions (e.g., thickness, as measured in a direction from the substrate 12 to the active region 20) of the layers of the dislocation bending structure 26 are selected based on the composition of the layers, the differences in the composition of adjacent layers in the dislocation bending structure 26, and/or a target strain for inducing dislocation bending of the dislocations present in the dislocation bending structure 26. The target strain can be defined using any solution, e.g., as a range defined by a minimum corresponding to an amount of strain required to induce dislocation bending and a maximum corresponding to an amount of strain that would cause cracking.

Figure 3:
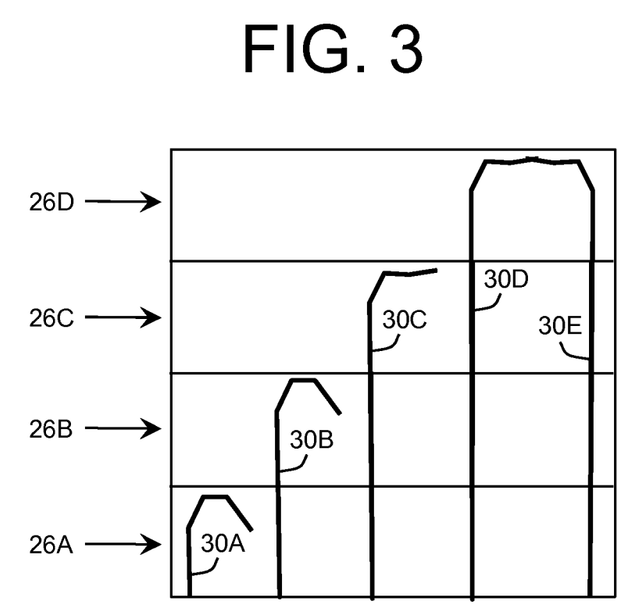
FIG. 3 shows illustrative band bending caused by the dislocation bending structure according to an embodiment.

FIG. 3 shows illustrative band bending caused by the dislocation bending structure 26 (FIG. 2) according to an embodiment. The dislocation bending structure 26 can include a plurality of layers 26A-26D. Dislocations 30A-30E are shown propagating into the dislocation bending structure 26 in layer 26A, which is located on a side closest to the substrate 12 (FIG. 2). As illustrated, dislocation bending can occur at the heterointerfaces of adjacent layers 26A-26D in the dislocation bending structure 26. Furthermore, the dislocation bending can occur in different ways/regimes. For example, dislocation 30A is shown bending into an opposite direction and back toward substrate 12 at a heterointerface between layers 26A, 26B. Similarly, dislocation 30B is shown bending into an opposite direction and back toward substrate 12 at a heterointerface between layers 26B, 26C. Dislocation 30C is shown bending in a direction substantially parallel to the heterointerface between layers 26C, 26D. Furthermore, dislocations 30D and 30E are shown bending in opposite directions substantially parallel to a heterointerface between layer 26D and another layer (not shown). By bending in opposite directions along the heterointerface, dislocations 30D, 30E meet and annihilate. It is understood that FIG. 3 only illustrates the band bending. To this extent, dislocations 30A-30C would continue after bending until they annihilate, reach, for example, the interface between the substrate 12 and an adjacent layer, extend to an outer surface of the emitting device 10, and/or the like.

In the example shown in FIG. 3, none of the dislocations 30A-30E present in layer 26A, which is located on a side closer to the substrate 12, passes through layer 26D, which is located on a side closer to the active region 20. As a result, the number of dislocations present within the active region 20 are reduced from those that would have been present without inclusion of the dislocation bending structure 26. While an illustrative combination of dislocation bendings are shown in FIG. 3, it is understood that any combination of various types of dislocation bendings can occur within the dislocation bending structure 26. To this extent, dislocations can undergo different types of dislocation bendings at the same heterointerface, dislocations can bend in any direction, any number of zero or more dislocations can bend at a heterointerface, and/or the like.

Returning to FIG. 2, the layers of dislocation bending structure 26 can be configured to induce dislocation bending using any of numerous embodiments. In an embodiment, the dislocation bending structure 26 can include a plurality of periods, each of which includes at least two adjacent layers of different material compositions, and is repeated within the dislocation bending structure 26. Alternatively, the layers can be aperiodic. The material composition of each layer can comprise, for example, a ternary or quaternary compound, in which the molar fractions of adjacent layers vary. The heterointerface between two adjacent layers can be abrupt, in which the molar fraction is changed immediately, or graded, in which the molar fraction is changed over a distance. Similarly, a layer in the dislocation bending structure 26 can be doped or undoped.

In an illustrative embodiment, the emitting device 10 is a group III-V materials based device, in which some or all of the various layers are formed of binary, ternary, quaternary, and/or the like, compounds selected from the group III-V materials system. In a more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, InGaN, AlGaInN, AlGaBN, AlInBN, and AlGaInBN with any molar fraction of group III elements.

An illustrative embodiment of a group III nitride based emitting device 10 includes an active region 20 composed of $In_y Al_x Ga_{1-x-y} N$, $Ga_z In_y Al_x B_{1-x-y-z} N$, an $Al_x Ga_{1-x} N$ semiconductor alloy, or the like. Similarly, the n-type cladding layer 18, the p-type blocking layer 22, and the p-type cladding layer 24 can be composed of $Al_x Ga_{1-x} N$, an $In_y Al_x Ga_{1-x-y} N$ alloy, a $Ga_z In_y Al_x B_{1-x-y-z} N$ alloy, or the like. The molar fractions given by x, y, and z can vary between the various layers 18, 20, 22, and 24. The substrate 12 can be sapphire, silicon carbide, or another suitable material. The nucleation layer 14 and/or the buffer layer 16 can be composed of AlN, an AlGaN/AlN superlattice, and/or the like.

A heterointerface between two or more layers in the emitting device 10 can have a graded composition. Similarly, a layer can have a composition and/or doping that is graded. For example, one or more of layers 18, 22, and 24 can comprise a graded composition. Furthermore, one or more layers in the emitting device 10 can have a short period superlattice structure. In an embodiment, the p-type cladding layer 24 and/or a p-type contact can be at least partially transparent (e.g., semi-transparent or transparent) to the electromagnetic radiation generated by the active region 20. For example, the p-type cladding layer 24 and/or the p-type contact can comprise a short period superlattice structure, such as an at least partially transparent magnesium (Mg)-doped AlGaN/AlGaN short period superlattice structure (SPSL). Furthermore, the p-type contact and/or an n-type contact can be at least partially reflective of the electromagnetic radiation generated by the active region 20. In another embodiment, the n-type cladding layer 18 and/or the n-type contact can be formed of a short period superlattice, such as an AlGaN SPSL, which is at least partially transparent to the electromagnetic radiation generated by the active region 20.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by an active region 20 described herein (e.g., peak emission wavelength+/−five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

The active region 20 can be formed of a plurality of quantum wells separated by barriers. In an embodiment, the barriers of the active region 20 can be composed of a material having molar fractions for one or more of the corresponding elements, which varies between each of the barriers. For example, the barriers can be composed of a $Ga_z In_y Al_x B_{1-x-y-z} N$ material where one or more of the molar fractions of Al, Ga, In, and/or B varies between the barriers. Furthermore, one or more of the barriers can comprise a graded composition, in which the molar concentration of an element (e.g., a group III element) in the barrier varies within the barrier, and/or doping. The variation in the graded composition can be selected such that a barrier height of the corresponding barrier increases or decreases in a direction from an n-type side of the active region 20 to a p-type side of the active region 20. In an embodiment, a conduction band energy discontinuity and a valance band discontinuity at each of a plurality of heterointerfaces between a barrier layer and a quantum well in the active region 20 is configured to be greater than twice an energy of a longitudinal optical phonon within a material of the active region 20.

In an embodiment, the layers of dislocation bending structure 26 comprise $Al_xGa_{1-x}N$, with different molar fractions of Al, x, for adjacent layers. In a more particular illustrative embodiment, the molar fractions of adjacent layers differ by at least five percent. In a still more particular illustrative embodiment, the molar fractions of adjacent layers can differ by more than fifty percent, which can provide a larger efficiency of the dislocation bending. Dislocation bending structure 26 can include any number of layers, each of which has any corresponding thickness. In an embodiment, dislocation bending structure 26 has a periodic structure including at least forty periods, each of which includes at least two layers and has a total thickness (period size) between approximately ten nanometers (one hundred Angstroms) and approximately one micron. In another embodiment, dislocation bending structure 26 has an aperiodic structure including at least forty pairs of layers, with each pair having a total thickness between approximately ten nanometers (one hundred Angstroms) and approximately one micron. When the dislocation bending structure 26 has an aperiodic structure, different pairs of adjacent layers can have varying total thicknesses. The total thicknesses for the different pairs of adjacent layers can vary, for example, by up to approximately fifty percent.

Additional details of illustrative embodiments of dislocation bending structure 26 are shown and described with reference to FIGS. 4-9, each of which shows an illustrative energy band diagram corresponding to an illustrative layer configuration of the dislocation bending structure 26 according to an embodiment.

Figure 4:
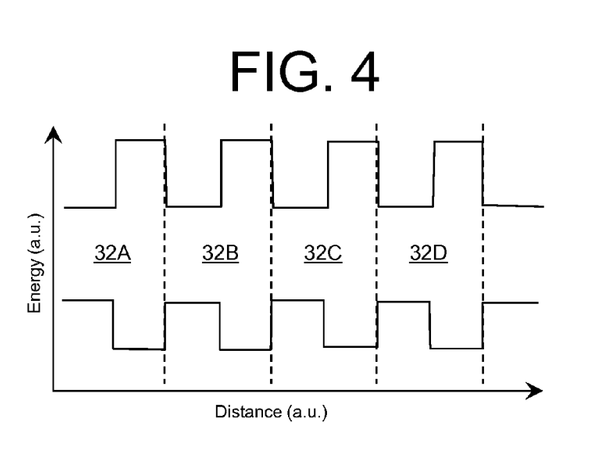
FIGS. 4-9 show illustrative energy band diagrams corresponding to illustrative layer configurations of the dislocation bending structure according to embodiments.

FIG. 4 shows an illustrative energy band diagram corresponding to a dislocation bending structure 26 (FIG. 2) according to an embodiment. The dislocation bending structure 26 can include a plurality of periods 32A-32D, each of which includes two layers. In an embodiment, the layers of each period 32A-32D are formed of AlGaN with the molar fraction of Al differing for each layer. In this case, the layer with a larger molar fraction of Al has a higher band gap than the layer with the lower molar fraction of Al. As described herein, the Al molar fractions of each layer in a period 32A-32D can differ by at least five percent. Regardless, the different Al molar fractions in the layers of a period 32A-32D can be selected to provide a desired amount of strain, which increases with the difference in the Al molar fraction. Similarly, the period size of each period 32A-32D can be selected to be sufficiently large to provide sufficient strain with the corresponding Al molar fractions, but not too large so as to cause cracking. As discussed herein, the period size of each period can be less than approximately one micron.

Figure 5:
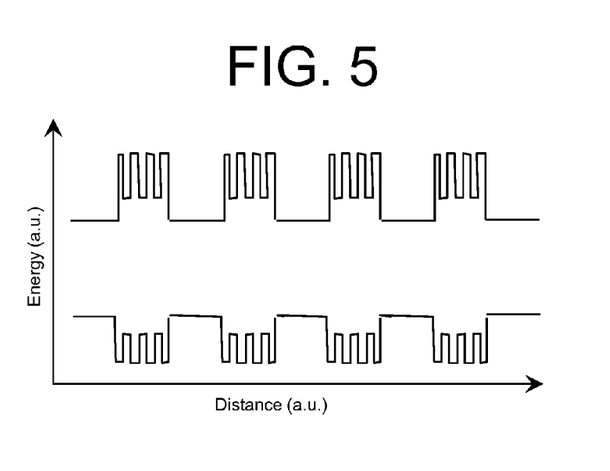
Figure 6:
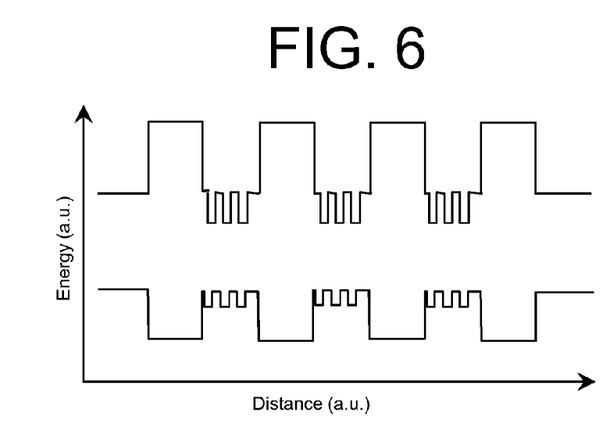
Figure 7:
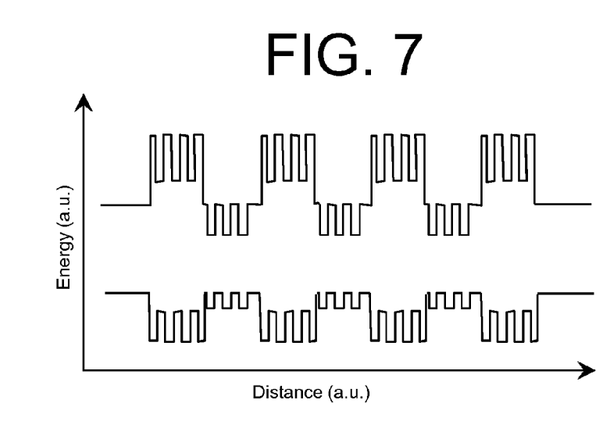

FIG. 5 shows an illustrative energy band diagram corresponding to a dislocation bending structure 26 (FIG. 2) according to another embodiment. In this case, the layers with a higher band gap are formed with short period superlattices. As illustrated, a short period superlattice can comprise multiple thin layers, which alternate between two or more band gaps. Similarly, FIG. 6 shows an illustrative energy band diagram corresponding to a dislocation bending structure 26 according to another embodiment, in which the layers with a lower band gap are formed with short period superlattices. Additionally, FIG. 7 shows an illustrative energy band diagram corresponding to a dislocation bending structure 26 according to another embodiment, in which all of the layers are formed with short period superlattices. In an embodiment, the short period superlattices are formed from AlGaN, with the molar fractions of Al in the thin layers of the short period superlattice alternating between two or more molar fractions. In a further illustrative embodiment, the molar fractions of Al in the thin layers differ by less than approximately forty percent. In a more particular illustrative embodiment, the molar fractions of Al in the thin layers differ by less than approximately ten percent.

Figure 8:
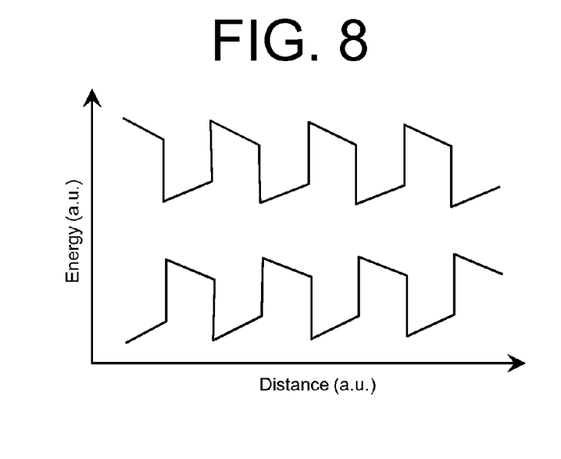

It is understood that the layers of the dislocation bending structure 26 can comprise any of various possible configurations. For example, FIG. 8 shows an illustrative energy band diagram corresponding to a dislocation bending structure 26 (FIG. 2) according to an embodiment, in which each of the layers has a graded energy band. The graded energy band can be provided by the corresponding layer having a graded composition, such as a graded molar fraction of Al. In this case, the molar fraction can be steadily changed over the thickness of the layer from a first value to a second value.

Figure 9:
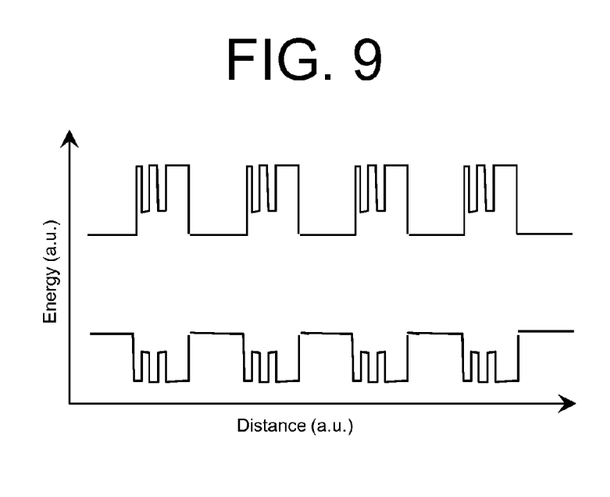

In another embodiment, portions of a layer can have different configurations. For example, FIG. 9 shows an illustrative energy band diagram corresponding to a dislocation bending structure 26 according to an embodiment, in which each layer having a larger energy band gap has a first portion formed using a short period superlattice and a second portion formed with a substantially constant composition.

Figure 10:
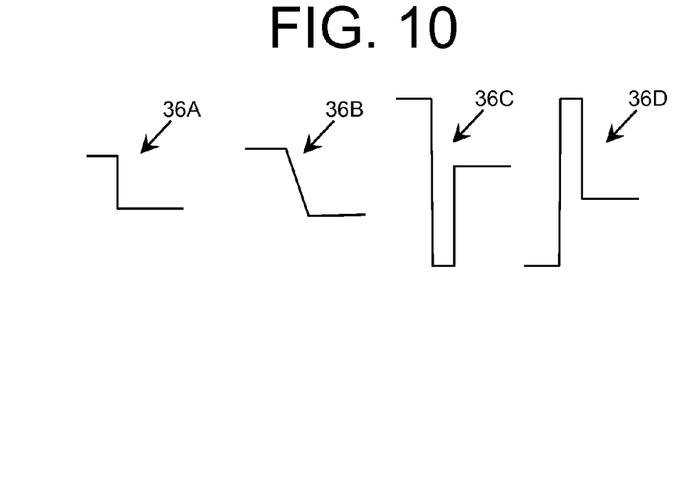
FIG. 10 shows several possible configurations of interfaces between layers in a dislocation bending structure according to an embodiment.

Still further, it is understood that the interfaces between layers of the dislocation bending structure 26 can have any of various possible configurations. For example, FIG. 10 shows several possible configurations of interfaces 36A-36D between layers in a dislocation bending structure 26 according to an embodiment. To this extent, interface 36A illustrates an abrupt change from an energy band diagram of a first layer to an energy band diagram of a second layer, while interface 36B illustrates a gradual change from an energy band diagram of a first layer to an energy band diagram of a second layer over a distance (e.g., a graded interface). Furthermore, interfaces 36C, 36D illustrate changes from an energy band diagram of a first layer to an energy band diagram of a second layer where the transition includes an intermediate step. A desired interface can be selected based on, for example, the respective molar fractions of an element (e.g., aluminum) in each of the layers, growth parameters of the layers, and/or the like. It is understood that interfaces 36A-36D are only illustrative and various alternative interfaces can be implemented. For example, a set of alternative interfaces can include interfaces comprising the mirror images of the interfaces 36A-36D. However, various additional configurations of interfaces between layers in a dislocation bending structure 26 are possible.

Figure 11:
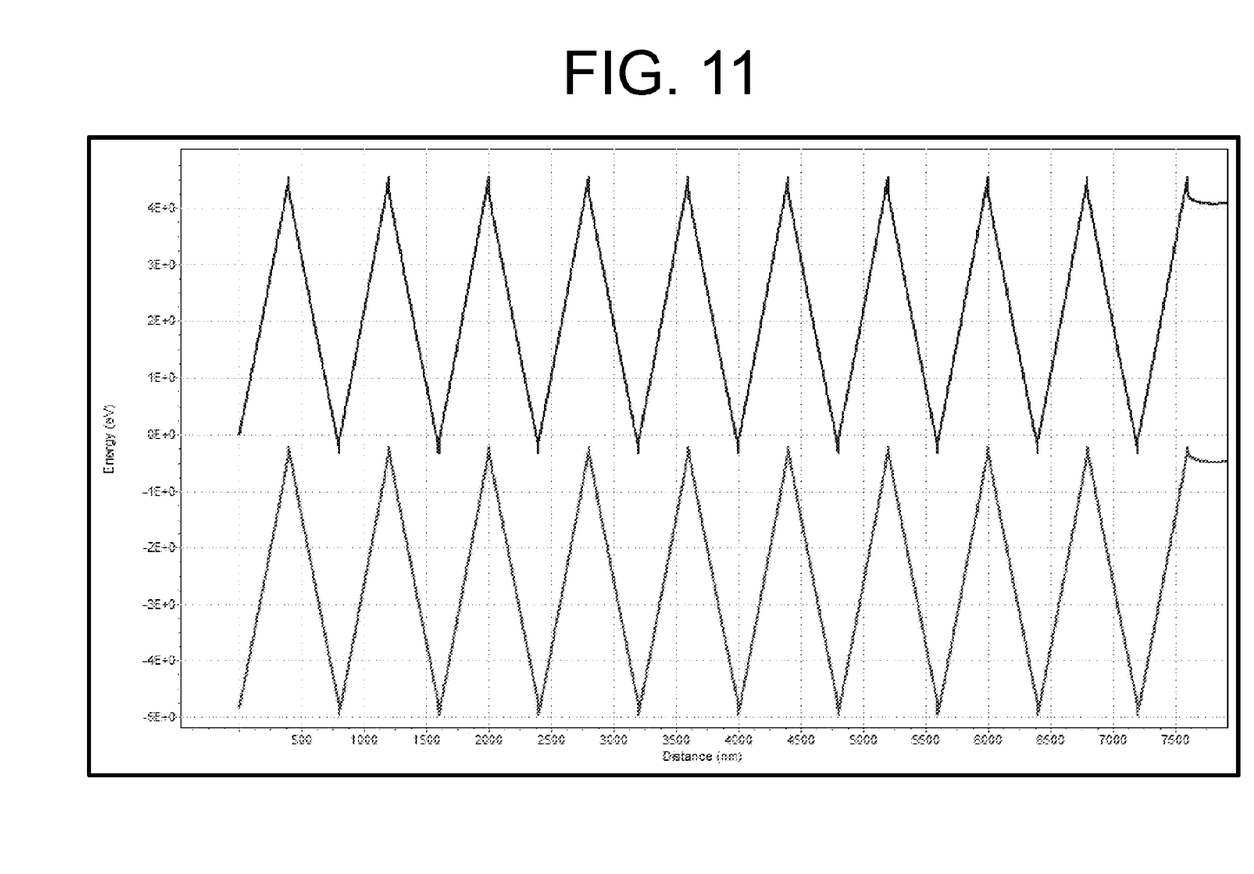
FIG. 11 shows an illustrative simulated energy band diagram for an undoped dislocation bending layer according to an embodiment.
Figure 12:
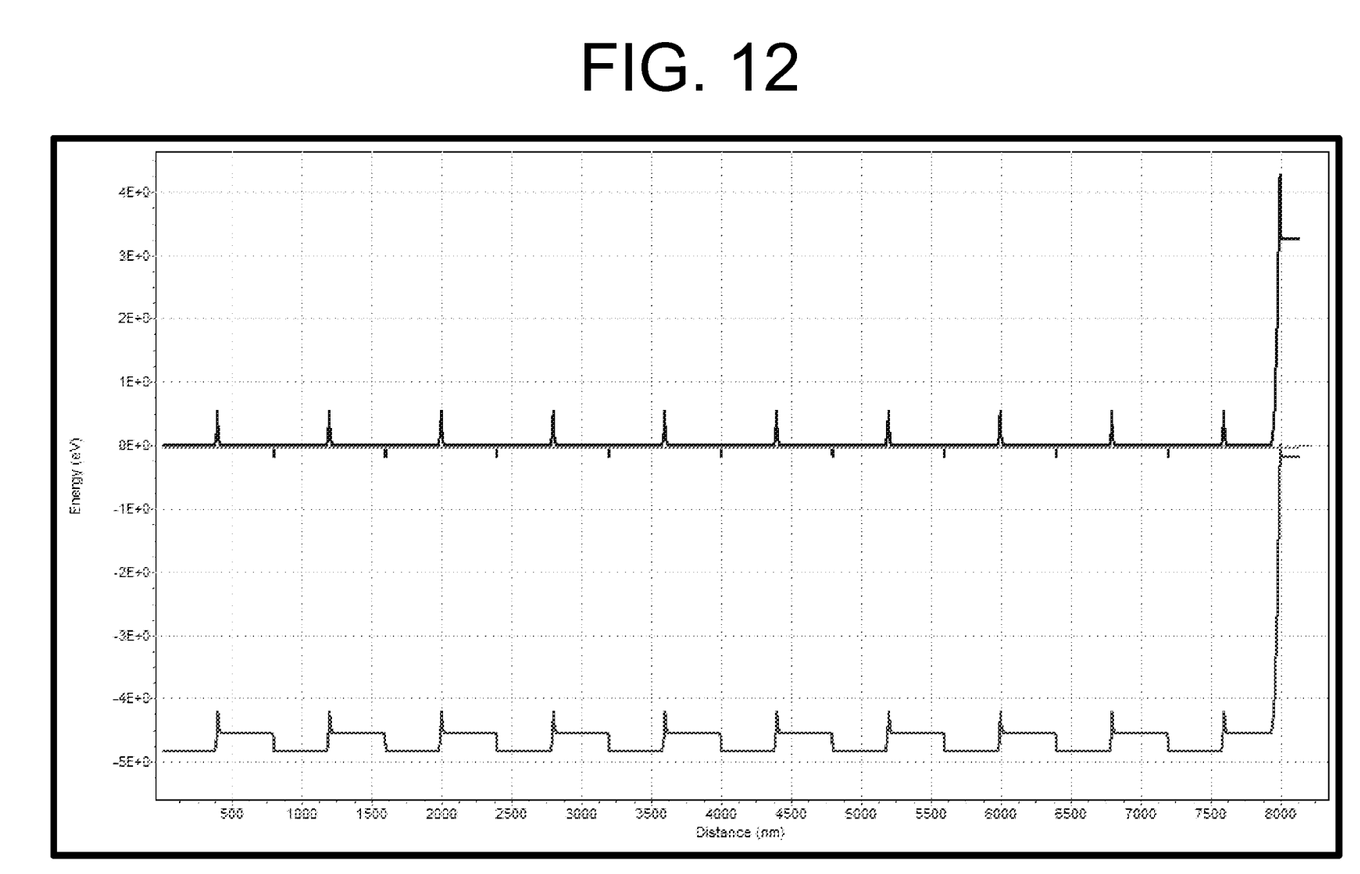
FIG. 12 shows an illustrative simulated energy band diagram for a doped dislocation bending layer according to an embodiment.

As described herein, the various layers of dislocation bending structure 26 can be doped or undoped. To this extent, FIGS. 11 and 12 show illustrative simulated energy band diagrams for an undoped dislocation bending layer and a doped n-type dislocation bending layer, respectively, according to embodiments. In each case, the corresponding dislocation bending layer can provide sequential filtration of dislocations propagating from the substrate 12 due to a fraction of the dislocations experiencing bending at each interface.

Returning to FIG. 2, it is understood that emitting device 10 can be manufactured using any solution. For example, a substrate 12 can be obtained, a nucleation layer 14 can be formed (e.g., grown, deposited, adhered, and/or the like) thereon, a buffer layer 16 can be formed on the nucleation layer 14, and the dislocation bending structure 26 can be formed on the buffer layer 16. In an alternative embodiment, the emitting device 10 can be formed without a nucleation layer 14, and the buffer layer 16 can be formed directly on the substrate 12. In still another alternative embodiment, the layers of dislocation bending structure 26 can be fused into the substrate 12, which can be covered with a transition layer facilitating fusion, and the dislocation bending structure 26 can be followed by a nucleation layer 14 and/or buffer layer 16.

In any event, the n-type cladding layer 18 can be formed above the dislocation bending structure 26. Furthermore, the active region 20, which can include quantum wells and barriers, can be formed on the n-type cladding layer 18 using any solution. The p-type blocking layer 22 can be formed on the active region 20 and the p-type cladding layer 24 can be formed on the p-type blocking layer 22 using any solution. It is understood that the manufacture of emitting device 10 can include additional processing, including for example: the deposition and removal of a temporary layer, such as mask layer; the patterning one or more layers; the formation of one or more additional layers/contacts not shown; application to a submount (e.g., via contact pads); and/or the like.

While shown and described herein as a method of designing and/or fabricating an emitting device, it is understood that aspects of the invention further provide various alternative embodiments. For example, in one embodiment, the invention provides a method of designing and/or fabricating a circuit that includes one or more of the emitting devices designed and fabricated as described herein.

Figure 13:
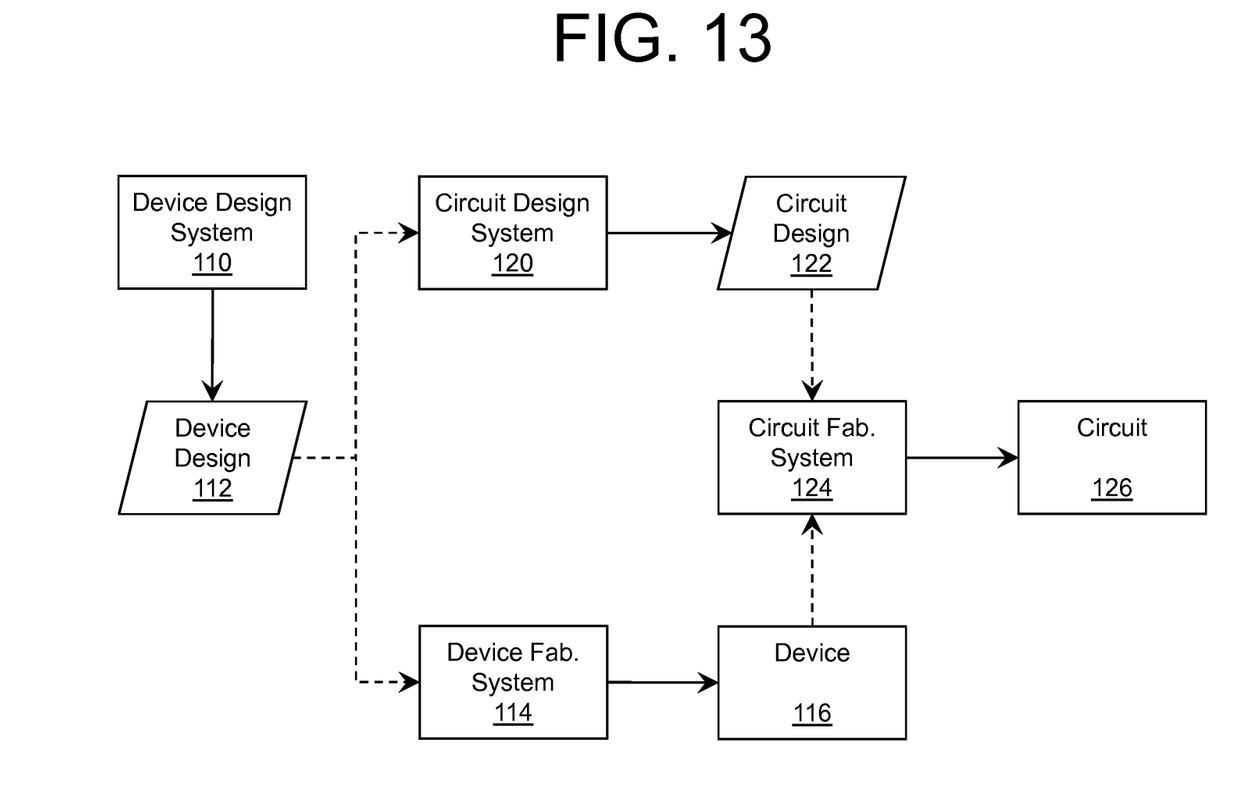
FIG. 13 shows an illustrative flow diagram for fabricating a circuit according to an embodiment.

To this extent, FIG. 13 shows an illustrative flow diagram for fabricating a circuit 126 according to an embodiment. Initially, a user can utilize a device design system 110 to generate a device design 112 for an emitting device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An emitting device comprising:
    a substrate;
    an active region located on a first side of the substrate; and
    a dislocation bending structure located between the substrate and the active region, wherein the dislocation bending structure comprises at least forty pairs of adjacent layers, wherein each pair of adjacent layers includes:
        a first layer composed of a material including an element; and
        a second layer composed of a material including the element, wherein a molar fraction of the element differs for the first layer and the second layer by at least five percent.

2. The emitting device of claim 1, wherein each pair of adjacent layers in the dislocation bending structure comprises a total thickness between approximately ten nanometers and approximately one micron.

3. The emitting device of claim 2, wherein the total thicknesses for different pairs of adjacent layers vary by up to approximately fifty percent.

4. The emitting device of claim 1, further comprising an intermediate layer located between the substrate and the dislocation bending structure.

5. The emitting device of claim 1, wherein the intermediate layer comprises a nucleation layer.

6. The emitting device of claim 1, wherein at least one of the first layer or the second layer of at least one pair of the adjacent layers comprises a short period superlattice.

7. The emitting device of claim 1, wherein at least one of the first layer or the second layer of at least one pair of the adjacent layers comprises at least one of: a graded composition or a graded doping.

8. The emitting device of claim 1, wherein the element comprises a group III element.

9. The emitting device of claim 8, wherein the material comprises a group III nitride-based material.

10. The emitting device of claim 1, wherein the active region includes a set of quantum wells interlaced with a set of barriers, and wherein at least one of the set of barriers has a graded molar fraction of a group III element.

11. An emitting device comprising:
a substrate;
an active region located on a first side of the substrate; and
a dislocation bending structure located between the substrate and the active region, wherein the dislocation bending structure comprises a means for causing at least some dislocations propagating from the substrate to at least one of: bend or annihilate, prior to reaching the active region, and wherein the means for causing includes a plurality of non-overlapping periods, wherein each period includes:
a first layer composed of a material including an element; and
a second layer composed of a material including the element, wherein a molar fraction of the element differs for the first layer and the second layer by at least five percent.

12. The emitting device of claim 11, wherein the means for causing includes a means for creating a strain sufficiently large to induce bending of the at least some dislocations.

13. The emitting device of claim 11, wherein the difference in the molar fractions is selected based on a target amount of strain.

14. The emitting device of claim 11, wherein the difference in the molar fractions is selected based on a thickness of at least one of the first layer or the second layer.

15. The emitting device of claim 11, wherein the plurality of layers includes at least forty periods, wherein each period includes at least two of the plurality of layers, and wherein the difference in the molar fractions between the at least two of the plurality of layers is at least five percent.

16. A method of manufacturing an emitting device, the method comprising:
forming a dislocation bending structure on a first side of a substrate, wherein the dislocation bending structure comprises a means for causing at least some dislocations propagating from the substrate to at least one of: bend or annihilate, prior to reaching the active region, wherein the forming the dislocation bending structure includes forming a plurality of non-overlapping periods, wherein each period includes:
a first layer composed of a material including an element; and
a second layer composed of a material including the element, wherein a molar fraction of the element differs for the first layer and the second layer by at least five percent; and
forming an active region on an opposing side of the dislocation bending structure as the substrate.

17. The method of claim 16, further comprising designing the dislocation bending structure to create a strain sufficiently large to induce bending of the at least some dislocations.

18. The method of claim 16, further comprising selecting the difference in the molar fractions based on a target amount of strain.

19. The method of claim 16, further comprising selecting the difference in the molar fractions based on a thickness of at least one of the first layer or the second layer.

20. The emitting device of claim 11, wherein at least one of the first layer or the second layer of at least one pair of the adjacent layers comprises a short period superlattice.

21. The method of claim 16, wherein at least one of the first layer or the second layer of at least one pair of the adjacent layers comprises a short period superlattice.

22. The emitting device of claim 1, wherein differences between molar fractions of the element in adjacent layers of the dislocation bending structure alternate between a higher molar fraction of the element and a lower molar fraction of the element.

23. The emitting device of claim 11, wherein differences between molar fractions of the element in adjacent layers of the dislocation bending structure alternate between a higher molar fraction of the element and a lower molar fraction of the element.

24. The method of claim 16, wherein differences between molar fractions of the element in adjacent layers of the dislocation bending structure alternate between a higher molar fraction of the element and a lower molar fraction of the element.

25. The emitting device of claim 1, wherein the material is aluminum gallium nitride and wherein the element is aluminum.

26. The emitting device of claim 11, wherein the material is aluminum gallium nitride and wherein the element is aluminum.

27. The method of claim 16, wherein the material is aluminum gallium nitride and wherein the element is aluminum.

\* \* \* \* \*